United States Patent [19]

Peterson

[11] Patent Number: 4,688,150

[45] Date of Patent: Aug. 18, 1987

[54] HIGH PIN COUNT CHIP CARRIER PACKAGE

[75] Inventor: Robert K. Peterson, Garland, Tex.

[73] Assignee: Texas Instruments Incorporated, Dallas, Tex.

[21] Appl. No.: 849,351

[22] Filed: Apr. 7, 1986

Related U.S. Application Data

[63] Continuation-in-part of Ser. No. 620,998, Jun. 15, 1984, abandoned.

[51] Int. Cl.⁴ .............................................. H05K 1/18
[52] U.S. Cl. ............................. 361/403; 174/52 FP; 361/400; 361/414
[58] Field of Search ...................... 174/52 FP, 16 HS; 361/386, 388, 400–405, 408–409

[56] References Cited

U.S. PATENT DOCUMENTS

| | | | |
|---|---|---|---|
| 2,772,382 | 11/1956 | Escoffery | 361/388 X |
| 3,842,189 | 10/1974 | Southgate | 361/408 X |
| 3,867,003 | 2/1975 | Morton et al. | 174/16 HS X |
| 3,982,308 | 9/1976 | Yoneda | 174/16 HS X |
| 4,037,270 | 7/1977 | Ahmann et al. | 174/52 FP X |
| 4,150,420 | 4/1979 | Berg | 361/401 |
| 4,203,129 | 5/1980 | Oktay et al. | 357/80 X |
| 4,296,456 | 10/1981 | Reid | 361/403 |
| 4,320,438 | 3/1982 | Ibrahim et al. | 361/401 |
| 4,415,025 | 11/1983 | Horvath | 357/80 X |
| 4,442,450 | 4/1984 | Lipshutz | 174/16 HS X |

FOREIGN PATENT DOCUMENTS 902219  8/1961  United Kingdom ........... 174/16 HS

OTHER PUBLICATIONS

Ciancanelli, "Circuit Module with Heat Transfer" IBM Technical Disclosure Bulletin, vol. 9, No. 7, Dec. 1976, p. 2652.

Primary Examiner—R. R. Kucia
Attorney, Agent, or Firm—Richard K. Robinson; James T. Comfort; Melvin Sharp

[57] ABSTRACT

A semiconductor chip carrier system has a printed circuit board supporting a plurality of ceramic carrier packages in rows and columns; each package has a plurality of flexible electrical conductive connection pads. A plurality of pressure exerting retaining means engage columns of the ceramic packages. The ends of the retaining means are connected to the printed circuit board for retaining the flexible electrical conductive connection pads of the columns of ceramic carrier packages in electrical contact with the printed circuit board thereby eliminating the need for solder connections.

5 Claims, 11 Drawing Figures

HIGH PIN COUNT CHIP CARRIER PACKAGE

This application is a continuation-in-part of U.S. patent application Ser. No. 620,998, filed on June 15, 1984 now abandoned.

This invention relates to a semiconductor chip carrier package system and more particularly to a system having a chip carrier package for a semiconductor chip having a high pin count, e.g. 172 pins.

In the past chip carrier packages such as the dual-in-line package have become interface limited as the pin count increases. For such packages to accommodate a high number of connection pins their size has become quite large and the printed wiring board area required for these chip carriers has increased correspondingly. As the package size increases lead lengths increase and circuit performance is degraded.

To meet this size, an open via chip carrier which utilizes a double row solder interface has been developed; though somewhat smaller than the DIP and chip carrier, it is still large for high pin count devices. Also a pin grid array type package has been developed which interfaces with a plated through hole carrier board. The carrier board adds considerable thickness to the package and the number of solder points required decreases the yield of acceptable boards and increases the repair difficulty.

To overcome the solder problems, bump bonding techniques have been tried but have proven unsuccessful owing to the inconsistent bump heights preventing good contact and resulting in opens in the completed system.

Accordingly it is an object of this invention to provide a reliable chip carrier and mounting means for a high pin count (172) integrated circuit.

Another object of the invention is to provide a chip carrier and mounting means which requires substantially reduced board area and remains testable and repairable.

A further object of the invention is to provide a chip carrier package suitable for use in a high pin count integrated circuit environment without substantially degrading circuit performance.

Yet another object of the invention is to provide a high pin count chip carrier package providing mechanically connected electrical contacts.

Still another object of the invention is to provide a high pin count chip carrier package which is easy to fabricate and use.

Briefly stated the invention comprises a high pin count chip carrier package system which includes a chip carrier, assembly and a printed circuit board. The chip carrier assembly is attached to the printed circuit board and electrical connection made therebetween by pressure exerted on flexible contact pads. The flexible contact pads act to compensate for different contact heights thereby eliminating electrical opens.

Other objects and features of the invention will become more readily apparent from the following detailed description when read in conjunction with the accompanying drawings, in which.

Figure 1:
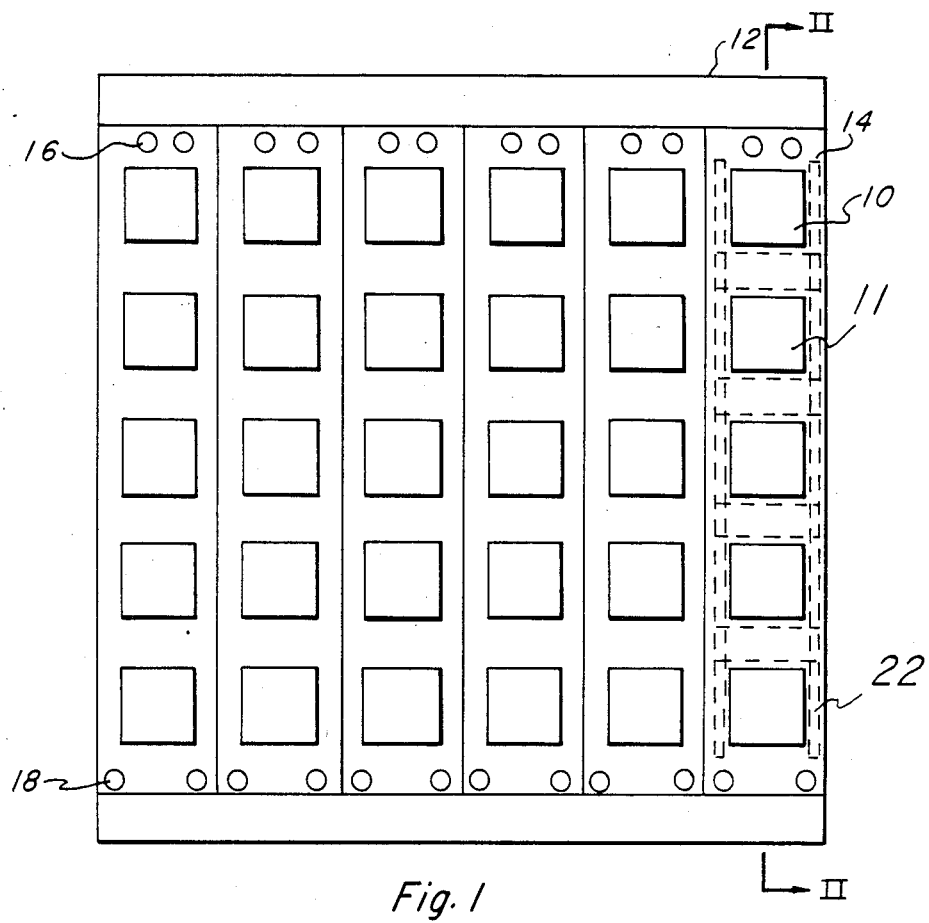
FIG. 1 is a top plan view of a printed wiring board embodying the subject matter of the present invention.

Referring now to FIG. 1, the chip carrier packages 10 of this invention are shown through openings 11 of retaining members 14 arranged, for example, in six columns of five chip carriers each on a surface mount board 12. Retaining members 14, one for each column, are attached to the surface mount board by screws 16 and 18 at opposite ends of the retaining members 14 for retaining the chip carriers 10 on the board 12 in electrical contact with the board 12.

The surface mount board (FIG. 2) is, for example, a phenolic resin printed circuit board board. Although other materials may be used a critical requirement is that the board surface flatness be substantially less than the compression of the connecting elastomeric conductive pads (hereinafter described) of the chip carriers so that connecting pads can engage the board in a controlled force relationship.

Figure 2:
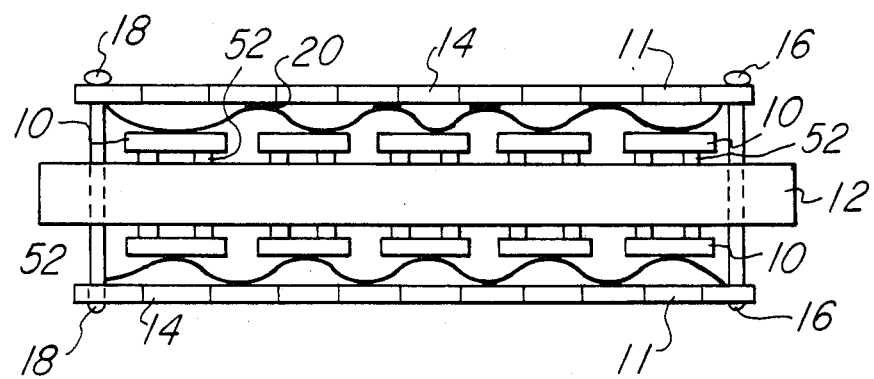
FIG. 2 is a partial, cross-sectional view of the chip carrier package mounted on a printed wiring board taken along line A—A of FIG. 1.

The retaining member 14 (FIGS. 1 & 2) is, for example, a metal, arcuate elongated thin cupped shaped beam member; this configuration provides a preload to the surface mount board 12 when attached by the screws 16 and 18 (FIG. 1) to take the arc out of the beam, which minimizes the cross-sectional area of the retaining member. 14 required for maintaining electrical contact between the surface mount board and the chip carriers FIG. 2, to which reference should now be made is a section view of the assembly of FIG. 1 as seen from section lines II—II. The board 12 in the case of FIG. 2 is a two sided board in which chip carriers 10 are mounted on both surfaces of the board 12. Electrical conductive compressive pads 52 provide electrical contact between the chip carriers 10 and the board 12 which has electrical conductors (not shown) printed on it to which the electrical conduction compression pads 52 are mounted. Leaf springs 22 press the chip carriers 10 to the electrical conductive compression pads 52 and board 12 in response to pressure provided by the compression of the retaining members 14 and screws 16 and 18

Figure 3:
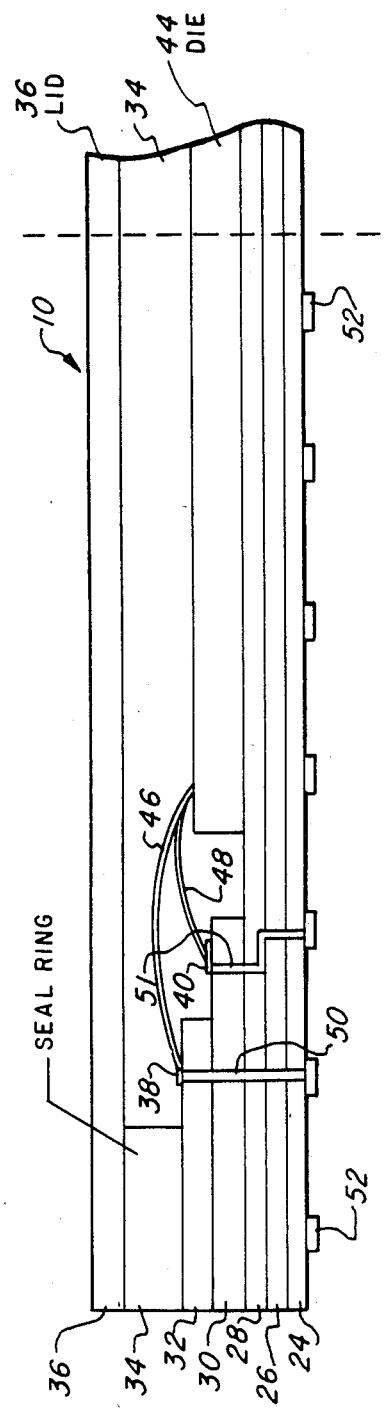
FIG. 3 is a partial, cross-sectional view of the chip carrier package.
Figure 5:
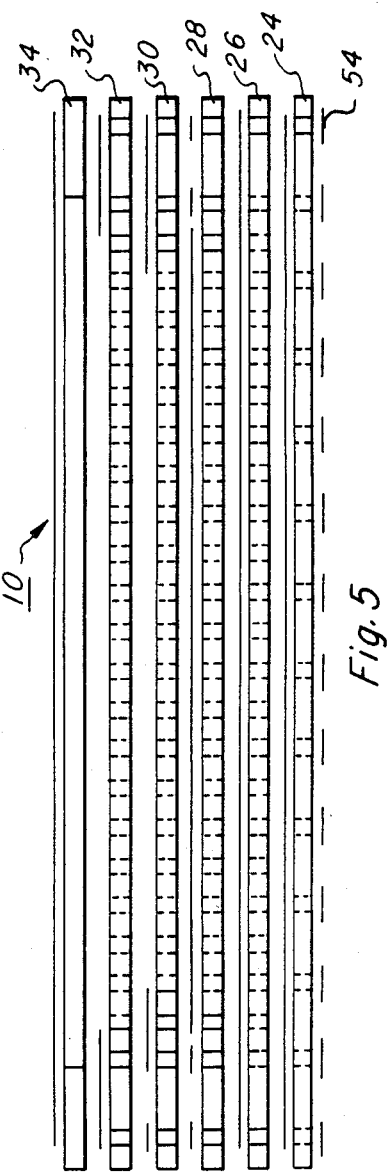
FIG. 5 is an exploded, cross-sectional view of the chip carrier package of FIG. 4.
Figure 4:
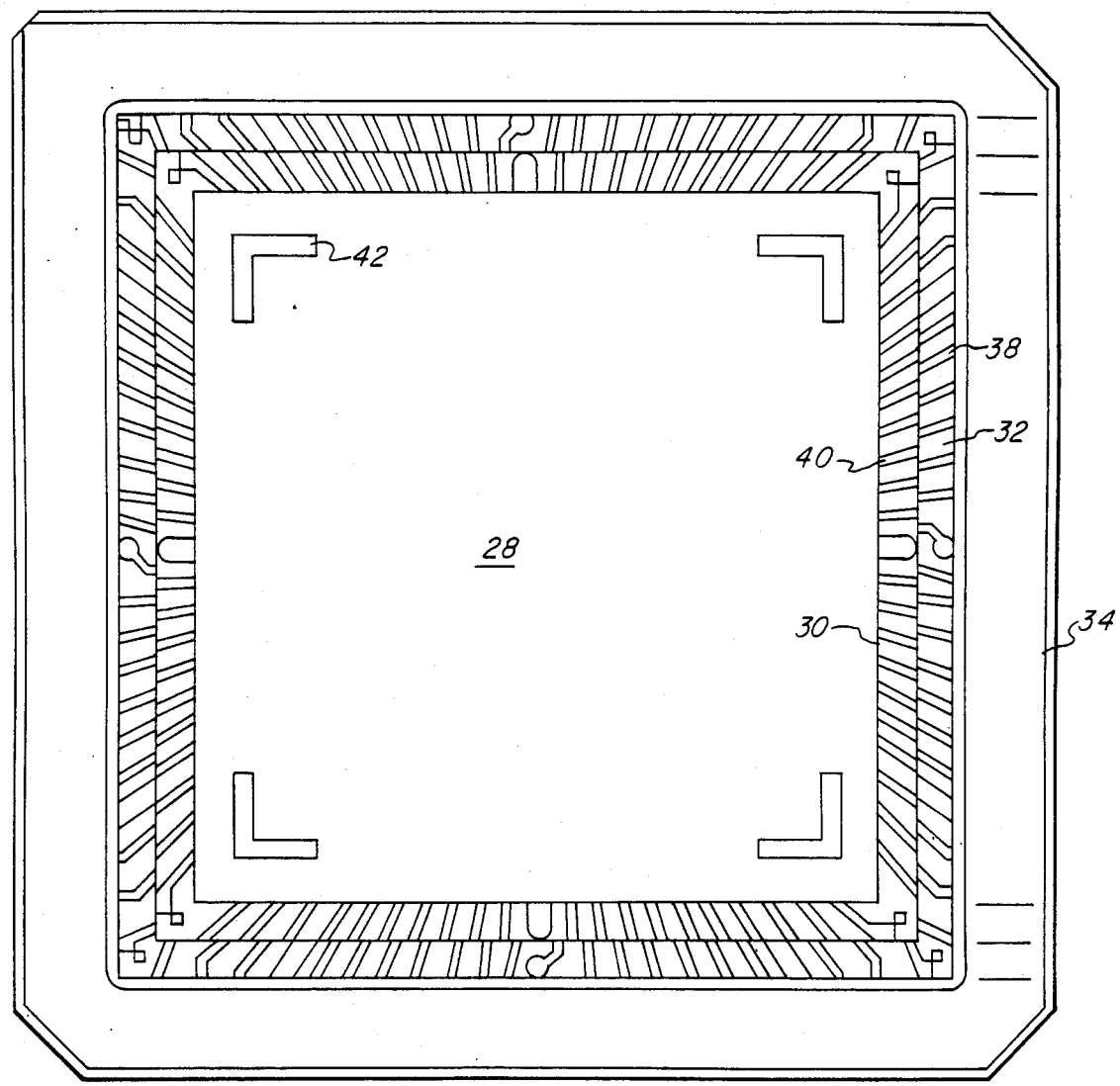
FIG. 4 is a top plan view of the chip carrier package with the lid and die removed.

The chip carrier 10 (FIG. 3) comprises a lower main routing member 24, an upper main routing member 26, a die mount member number 28, a lower wire bond tier 30, an upper wire bond tier 32, a seal ring 34 and a lid 36. The lid 36 is, for example, made of an alloyed metal sold under the trademark "KOVAR". Looking down on the chip carrier package without the lid 36 (FIG. 4) the seal ring 34 defines the perimeter of the package and forms the first step down to the chip mount layer 28. The upper and lower bond tiers 32 and 30 with their wire bond traces 38 and 40, respectively, form the second and third steps to the chip mount layer 28. Chip mount layer 28 has chip registration markers 42.

A semiconductor chip or die 44 (FIG. 3), which may be, for example, a very large scale integrated circuit (VLSIC) or a very high speed integrated circuit (VHSIC), is soldered to the chip mount layer 28 within the registration markings 42; thereafter external leads 46 and 48, which are, for example, gold wires, are bonded, respectively, to the upper and lower wire bond traces 38 and 40 and to the chip terminals. The traces 38 and 40 are connected, respectively, through vias 50 and 51 to conductive pads 52.

The chip carrier packages 10 is fabricated (FIGS. 5 & 6a–6f) using a slurry of clay (Kaolin) and alumina in proportions sufficient to produce a package having a content of about 94 to 96 percent alumina. The slurry is cast onto a drying pad such as, for example, MYLAR film and dried to a consistency where it can be rolled off the MYLAR film.

Next the roll is unrolled, cut into preselected layer shapes, preferably square or rectangular, and punched to form selected via or hole patterns.

Then, a metalization pattern is screen printed on the substrate using thick film deposition techniques. The metalization material is a refractory metal which may be, for example, tungsten or moly-manganese. The process to this point is then repeated for the remaining layers 26, 28, 30, 32 and 34 (FIGS. 6b–6f).

Finally the layered package is fired at about 1700 degrees Celsius for about one hour to form a substantially monolithic structure.

To complete the package the elastomeric pads 52 (FIGS. 2 and 3) are then formed on the conductive pads 54 for vias 50 (FIG. 6a) of the lower main routing layer 24. The elastomeric pads 52 are, for example, pads of conductive adhesive sold by Chomerics Incorporated under the trademark "4041 Conductive Ahesive".

Figure 6A:
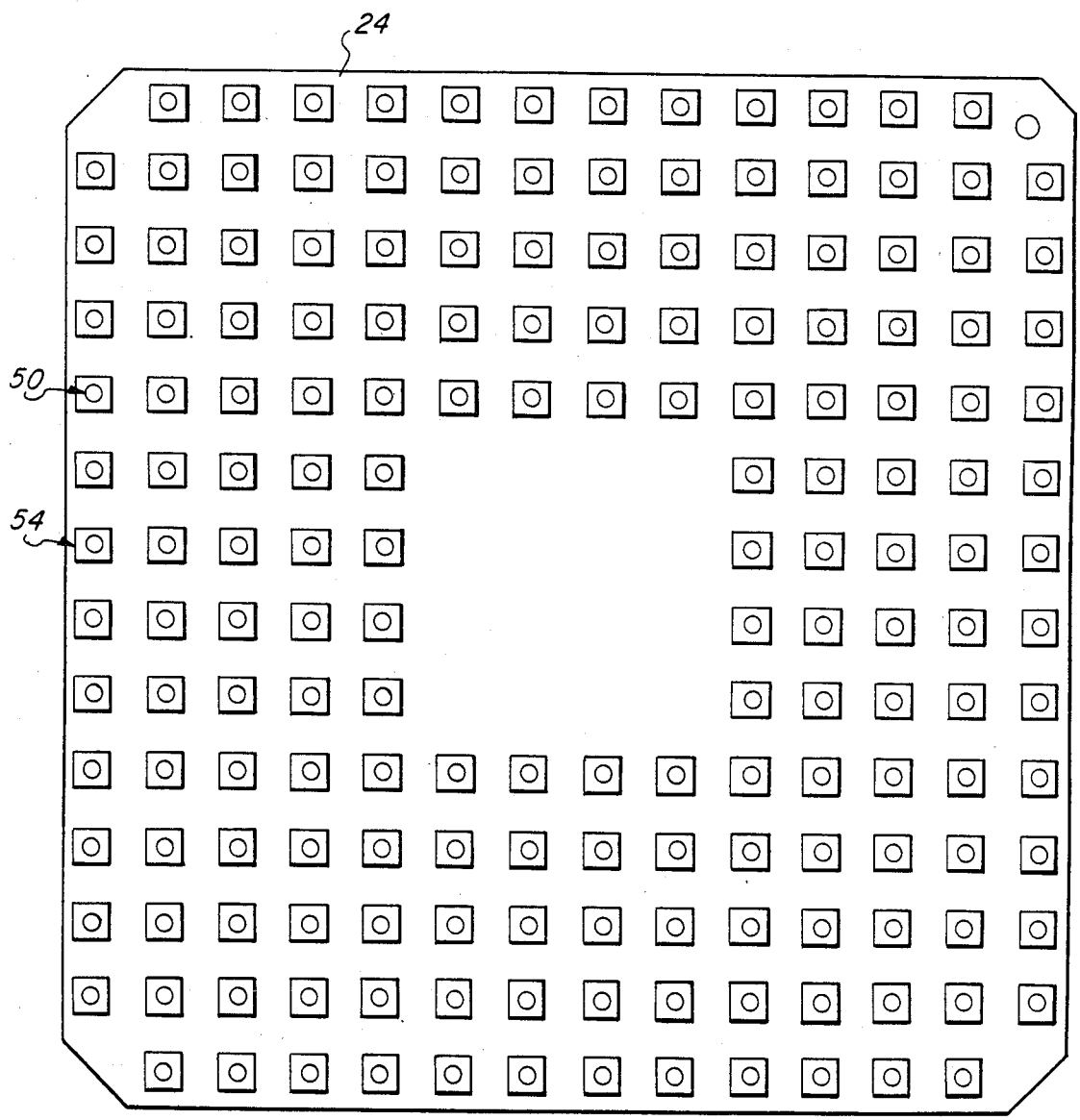
FIGS. 6a-6f are one quarter top plan views of the chip carrier package layers of FIG. 5.
Figure 6B:
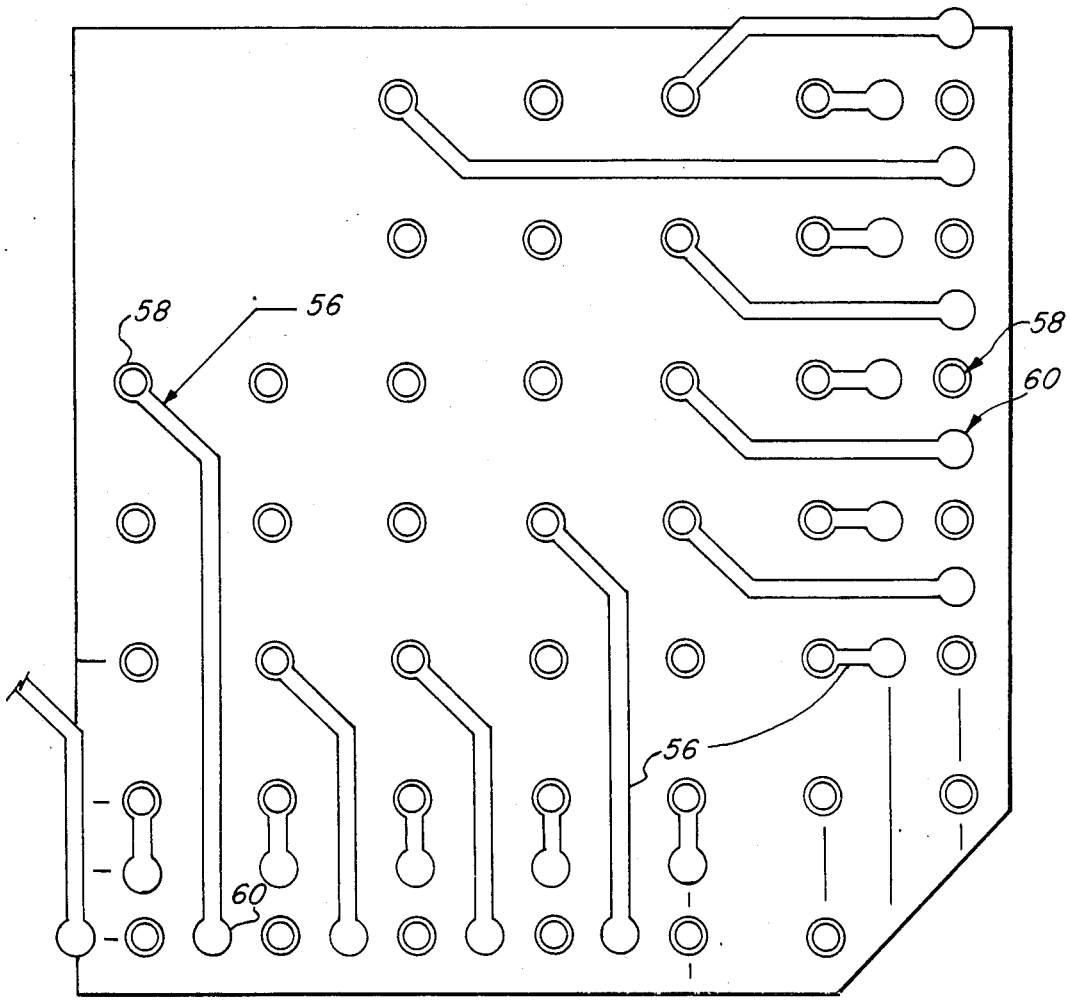
Figure 6C:
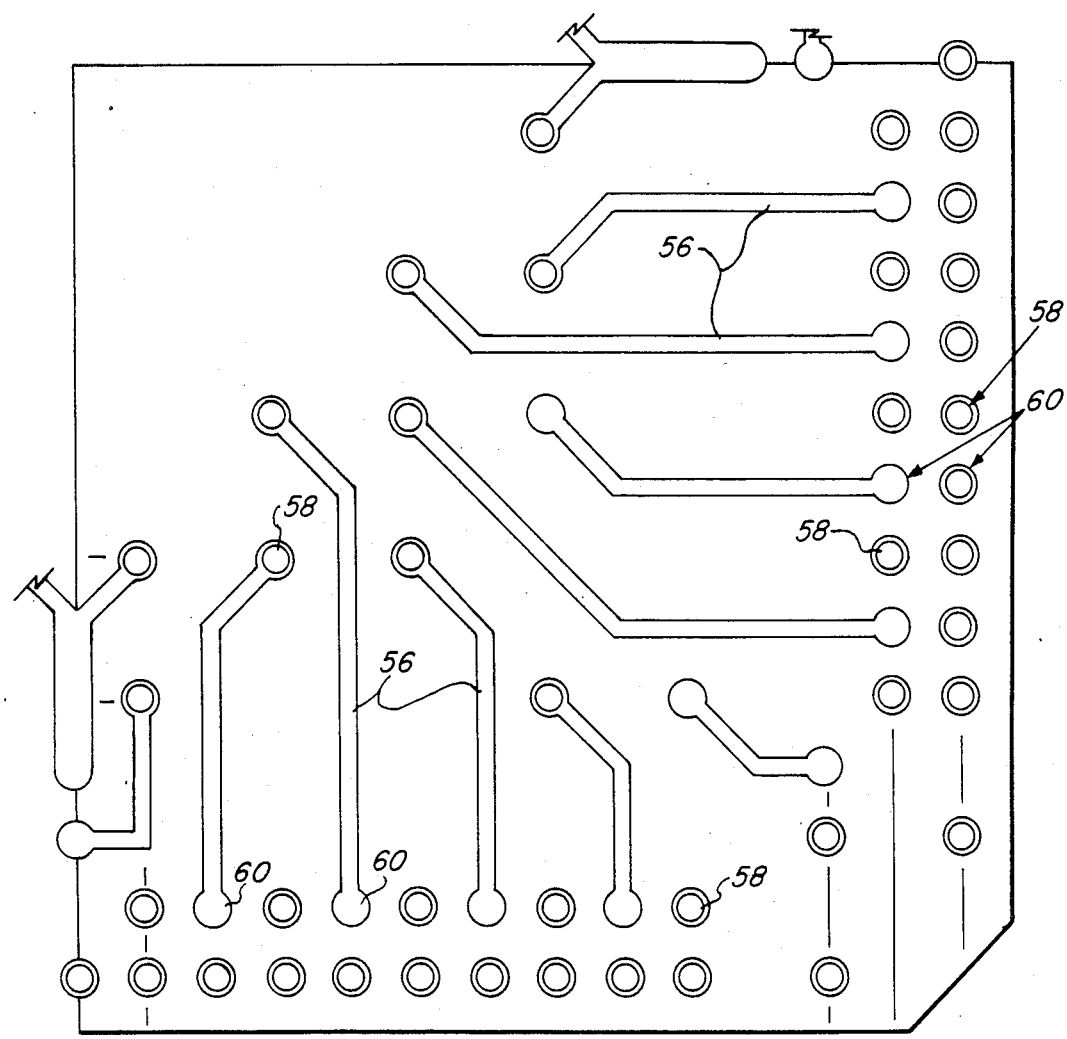
Figure 6D:
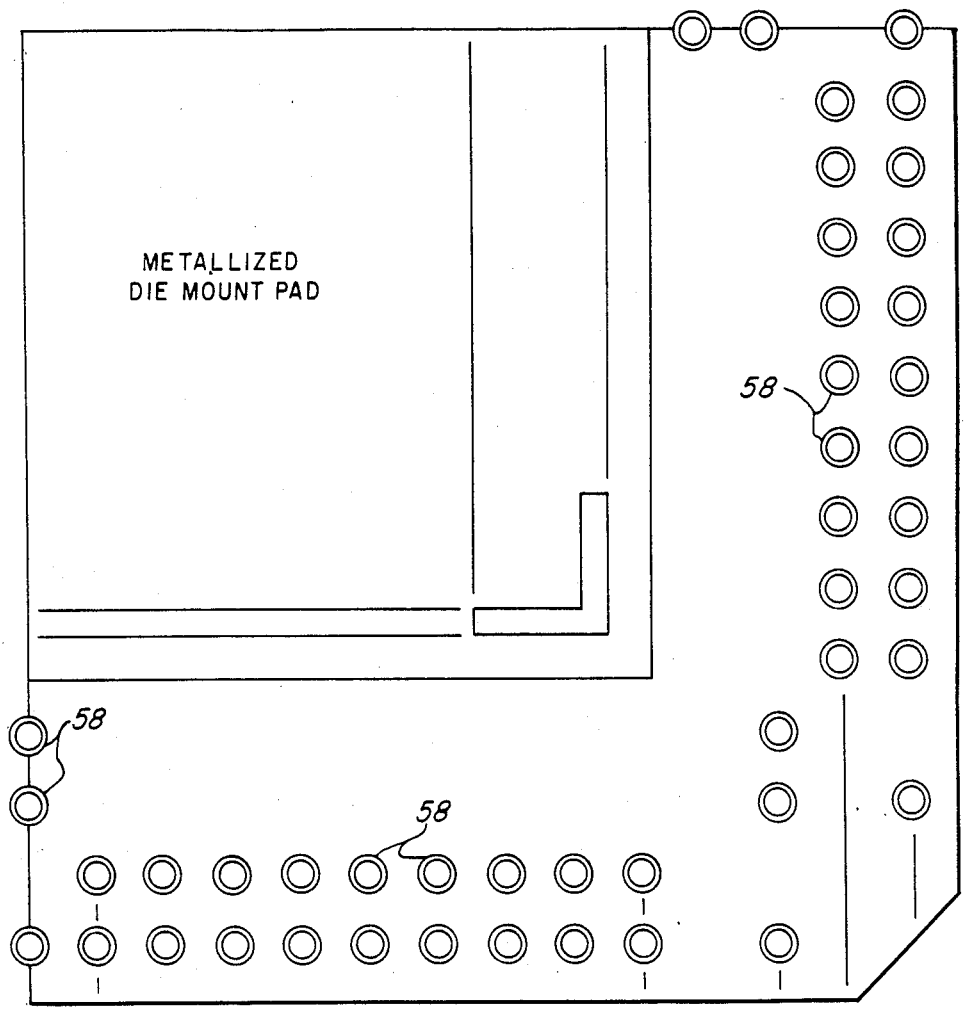
Figure 6E:
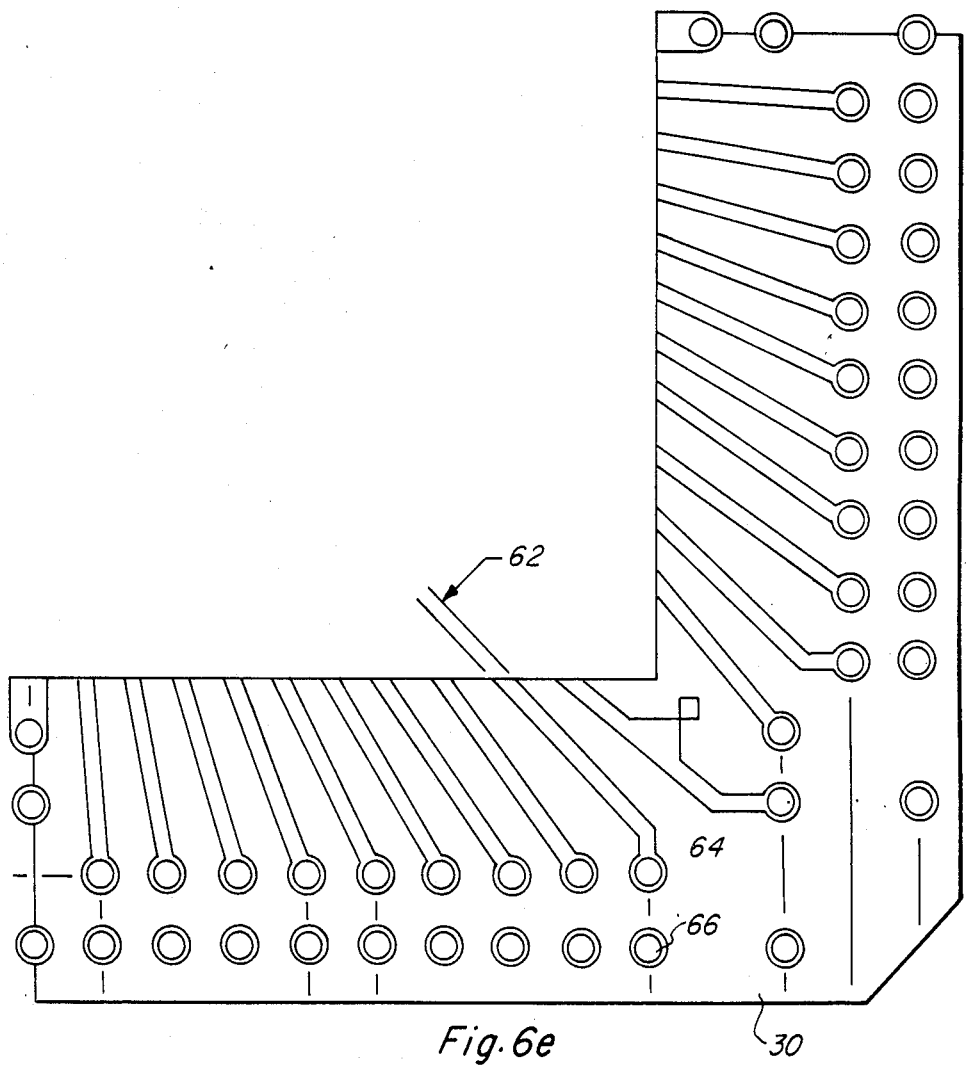
Figure 6F:
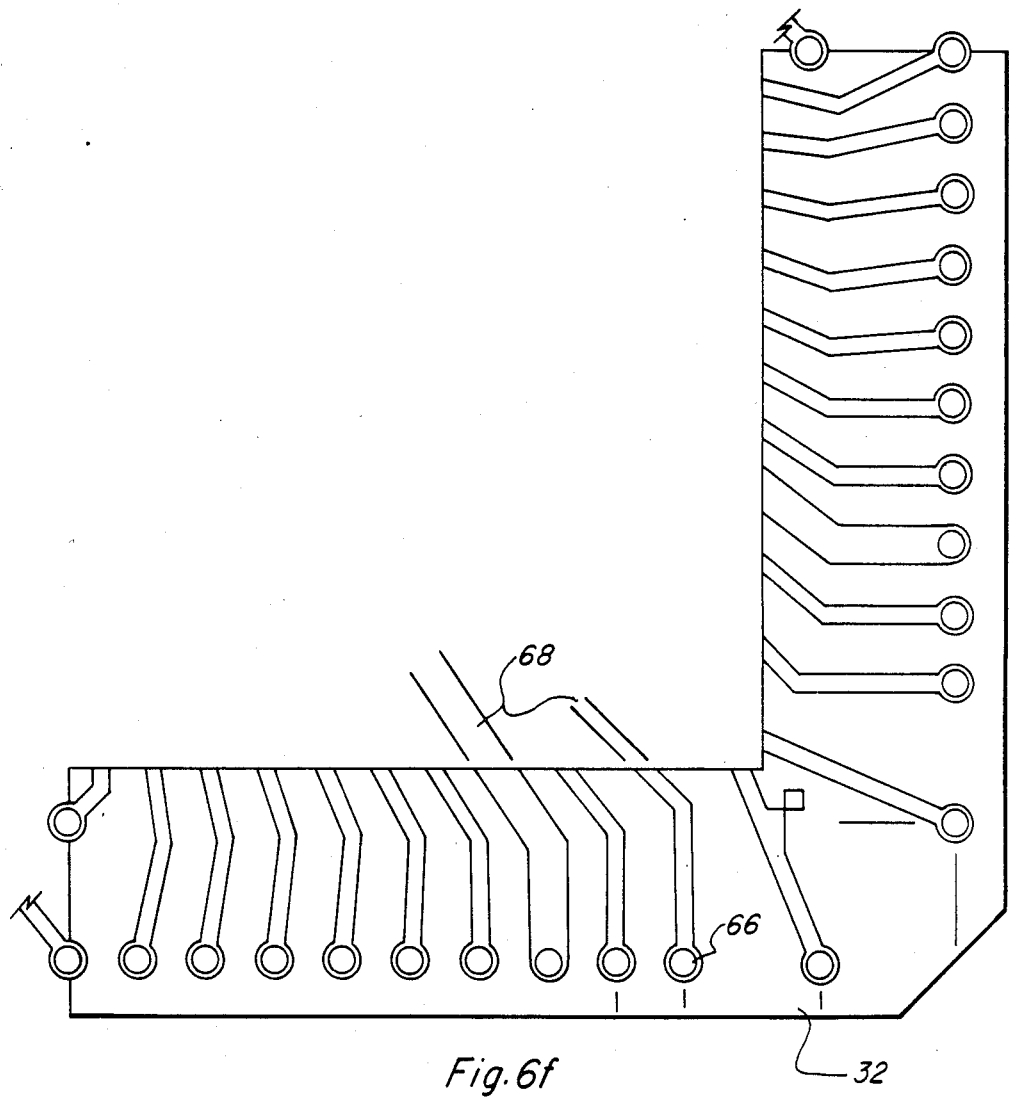

As shown in FIG. 6a and as an example, 176 conductive pads 54 are formed on the bottom of the lower main routing layer 24 to accommodate a 172 pin die. The routing traces 56 for the lower main routing layer 24 are shown in FIG. 6b. The concentric circles 58 indicate passthroughs and the single circles 60 indicate via transfers through traces 56 to vias 58. Likewise, FIG. 6c depicts the output routing metalization for the upper main routing layer 26; whilst FIG. 6d shows die mount routing pass through vias 58 for the die mount layer. The lower wire bond traces 62 (FIG. 6e) for the lower wire bond tier 30 have ends terminating adjacent to the tier's inner periphery and opposing ends terminating at vias 64. The traces 62 form bonding pads for the wire leads. Vias 66 form passways to the upper wire traces 68 (FIG. 6f) of the upper wire bond tier 32. The traces 68 have ends terminating adjacent to the inner periphery of the upper bond tier 32 and opposite ends terminating at vias 66. The traces 68 form wire bonding pads.

In operation (FIG. 1) the chip carriers are positioned on the carrier printed wiring board 12. The beams 14 are fixed to the board 12 by the screws 16 and 18. When the beams are attached, the dual leaf springs 22 apply a preselected force (four pounds for the example of FIG. 1) to the chip carriers 10 which translates into about 100 pounds per square inch of pressure on the conductive elastomeric pads 52. The pressure assures good electrical contact between the chip carrier package and the printed wiring board by increasing (loosening) the tolerances for the heights of the respective contacts; that is the contacts of the chip carrier and of the printed wiring board need not end in the same plane for electrical contact.

Although preferred embodiments of the present invention have been described in detail, it is to be understood that various changes, substitutions and alterations can be made therein without departing from the scope of the invention as defined by the appended claims.

What is claimed is:

1. A chip carrier package assembly comprising: a printed circuit board having oppositely disposed faces with electrical circuits printed on both faces;
   at least a first and second chip carrier with each single chip carrier having at least one semiconductor chip with bonding points mounted thereon and each single chip carrier having a plurality of electrical contacts and conductors connecting preselected bonding points to preselected electrical contacts;
   at least two oppositely disposed rails with each single rail having a pressure bias spring mounted on a first surface;
   a plurality of conductive pads with each single electrical contact having a conductive pad mounted thereon; and
   mechanical connectors connecting the one rail to other rail sandwiching an assembly between one rail and other rail with the assembly including the printed circuit board with the first chip carrier being electrically connected to the one surface with electrical contact being made between the electrical circuits thereon and the electrical contacts of the first chip carrier via the conductive pads and the second chip carrier being electrically connected to the other surface with electrical contact being made between the electrical circuits thereon and the electrical contacts of the second chip carrier via the conductive pads and pressure bias being provided by one rail's pressure bias spring applying pressure to the first chip carrier and the other rail's pressure bias spring applying pressure to the second chip carrier.

2. The chip carrier package assembly according to claim 1 wherein each chip carrier comprises:
   (a) a chip mount for mounting the semiconductor chip;
   (b) a plurality of outwardly stepping conductor tiers, each tier having a plurality of electrical conductive traces for connection to selected ones of the electrical contacts.

3. The chip carrier package assembly according to claim 2 wherein each single chip mount further includes a seal ring and a lid, said seal ring adapted to receive the lid to enclose the semiconductor chip in the chip mount.

4. The chip carrier package assembly according to claim 3 wherein the chip mount comprises a cofired ceramic chip mount.

5. The chip carrier package for a surface mount board according to claim 1 wherein the semiconductor chip is selected from the group consisting of very large scale semiconductor integrated circuits, and very high speed integrated circuits.

* * * * *